(12) United States Patent
Miller (10) Patent No.: US 6,842,052 B2
(45) Date of Patent: Jan. 11, 2005

(54) MULTIPLE ASYNCHRONOUS SWITCHING SYSTEM

(75) Inventor: William V. Miller, Arlington, TX (US)

(73) Assignee: VIA-Cyrix, Inc., Fremont, CA (US)

( * ) Notice: Subject to any disclaimer, the term of this patent is extended or adjusted under 35 U.S.C. 154(b) by 0 days.

(21) Appl. No.: 10/170,077

(22) Filed: Jun. 11, 2002

(65) Prior Publication Data

US 2003/0227300 A1 Dec. 11, 2003

(51) Int. Cl.[7] .............................................. H03L 17/00
(52) U.S. Cl. ...................................... 327/99; 327/298
(58) Field of Search ........................ 327/99, 298, 403, 327/407; 375/357

(56) References Cited

U.S. PATENT DOCUMENTS

| | | | | |
|---|---|---|---|---|
| 5,155,380 A | * | 10/1992 | Hwang et al. ................. | 327/99 |
| 5,274,678 A | * | 12/1993 | Ferolito et al. ............. | 375/357 |
| 5,652,536 A | * | 7/1997 | Nookala et al. ............. | 327/298 |
| 6,107,841 A | | 8/2000 | Goodnow ..................... | 327/99 |

* cited by examiner

*Primary Examiner*—Minh Nguyen
(74) *Attorney, Agent, or Firm*—Finnegan, Henderson, Farabow, Garrett & Dunner, L.L.P.

(57) ABSTRACT

A system for allowing an asynchronous clock signal to be selected from a plurality of asynchronous clock signals without causing glitches. In the system, a requestor is connected to control signals. The control signals indicate to the requestor which asynchronous clock signal, of the two or more clock signals, to request. The requestor informs a selector of the request. The selector determines which asynchronous clock signal was selected. The selected asynchronous clock is then detected by the detector. The detector feeds the selected asynchronous clock signal to a signal output. The signal output releases the selected asynchronous clock signal.

21 Claims, 9 Drawing Sheets

MULTIPLE ASYNCHRONOUS SWITCHING SYSTEM

DESCRIPTION OF THE INVENTION

1. Field of the Invention

The present invention relates generally to field of clock signals and more particularly to a switching circuit for switching between asynchronous clock signals without glitches.

2. Background of the Invention

When supplying asynchronous clock signals to logic, it is important to be able to switch signals without causing glitches. A glitch is any error in the signal that occurs due to unsuccessful switching, such as a pulse width violation. If the switched clock is not switched carefully, the resulting signal could contain errors. U.S. Pat. No. 6,107,841 describes a method of glitch free switching among a plurality of clock sources relying upon switching circuitry and metastable latches. As described in the '841 patent, the invention relies upon the switching circuitry generating two control signals with the second control signal interacting with the metastable latches.

The article Switching Asynchronous Clocks by Vijay Nebhrajani provides suggestions for glitch free clock switching. However, as acknowledged by the article, the circuit has timing problems that can result in glitches.

There is a need for a clock switching system that is able to reduce glitches when switching between multiple asynchronous clock sources.

There is also a need for a clock switching system that utilizes reduced logic circuitry to reduce glitches when switching between multiple asynchronous clocks.

SUMMARY OF THE INVENTION

In accordance with the purpose of the invention, as embodied and broadly described herein, the invention comprises an asynchronous clock switching system comprising: two or more asynchronous clock signals; a requestor, coupled to a detector, for requesting an asynchronous clock signal from the two or more asynchronous clock signals; selection signals, including a delay, coupled to the detector, which selects an asynchronous clock signal from the two or more asynchronous clock signals; the detector, coupled to a signal output, which detects the selected asynchronous clock signal; and the signal output, coupled to the detector and the requestor, which outputs the selected asynchronous clock signal.

In accordance with the purpose of the invention, as embodied and broadly described herein another embodiment of, the invention comprises an asynchronous clock switching system comprising: a requestor; one or more control signals input into the requestor; one or more request signals output from the requestor; one or more second detector logic gates for receiving respective of the one or more request signals; one or more state machines for receiving input from the respective of the one or more second detector logic gates; one or more selection signals associated with the respective one or more state machines, coupled to buffers, output from the one or more state machines; one or more first detector logic gates associated with the respective one or more state machines for receiving one or more selection signals not associated with the respective one or more state machines and outputting to the second detector logic gates; one or more third detector logic gates associated with the respective one or more state machines for receiving the respective one or more selection signals; two or more asynchronous clock signals coupled to an input of the respective one or more third detector logic gate; a signal output receiving an input from the one or more third detector logic gates and providing an output to the requestor; and one or more inverters associated with the respective one or more state machines for receiving the respective two or more asynchronous clock signals and outputting to the respective one or more state machines.

In accordance with the purpose of the invention, as embodied and broadly described herein another embodiment of, the invention comprises an asynchronous clock switching system comprising: a requestor; one or more control signals input into the requestor; one or more request signals output from the requestor; one or more second detector logic gates for receiving respective of the one or more request signals; one or more state machines for receiving input from the respective of the one or more second detector logic gates; one or more selection signals associated with the respective one or more state machines, coupled to buffers, output from the one or more state machines; one or more first detector logic gates associated with the respective one or more state machines for receiving one or more selection signals not associated with the respective one or more state machines and outputting to the second detector logic gates; one or more third detector logic gates associated with the respective one or more state machines for receiving the respective one or more selection signals; two or more asynchronous clock signals coupled to an input of the respective one or more third detector logic gate; and a signal output receiving an input from the one or more third detector logic gates and providing an output to the requestor.

In accordance with the purpose of the invention, as embodied and broadly described herein another embodiment of, the invention comprises an asynchronous clock switching system comprising: a requestor; one control signal input into the requestor; outputs from the requestor comprise two request signals; two first detector logic gates for receiving the two respective request signals as inputs; two state machines for receiving inputs from the two respective first detector logic gates; two selection signals output from the two respective state machines; two detector inverters for receiving the respective non-associated selection signals as inputs and providing output into the respective two first detector logic gates; two second detector logic gates for receiving the respective two selection signals; two asynchronous clock signals input into the respective two second detector logic gates; two inverters for receiving the respective two asynchronous clock signals and providing output to the two respective state machines; a signal output receiving inputs from the two second detector logic gates; and the signal output coupled to the requestor.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Figure 1:
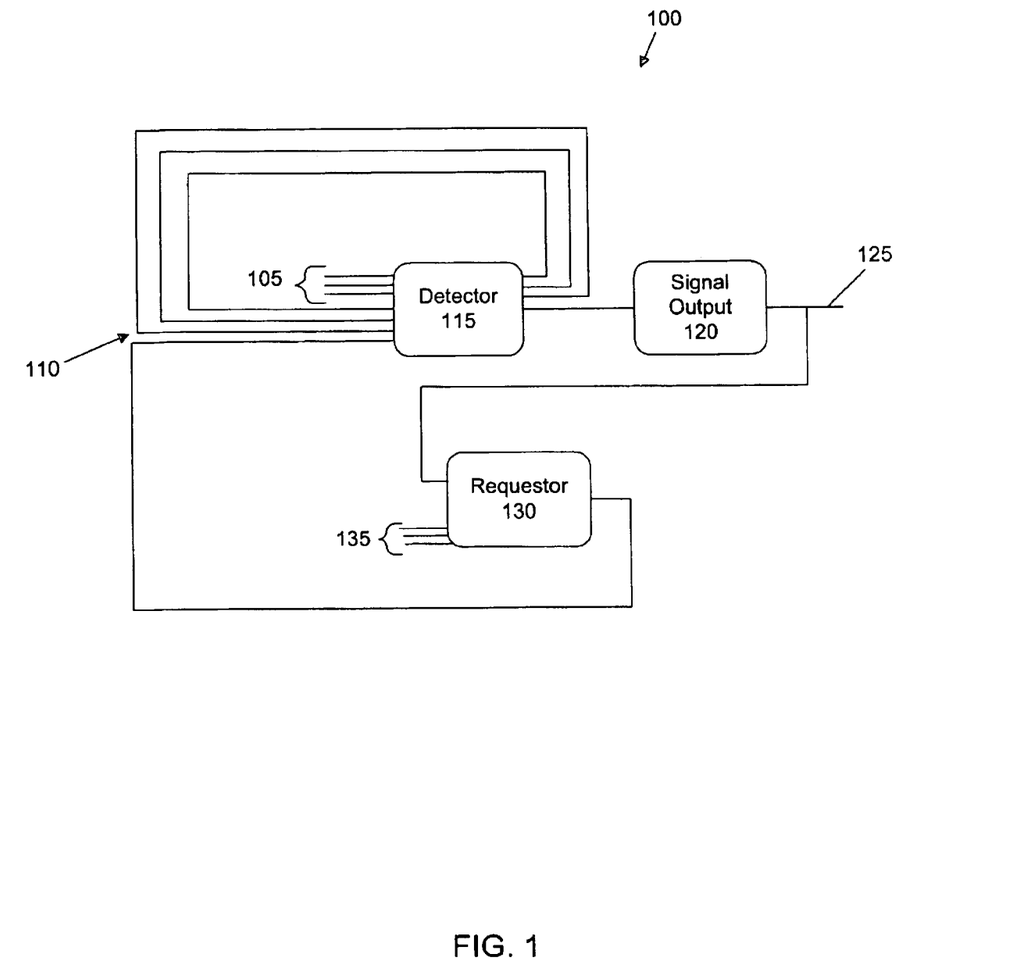
FIG. 1 is an embodiment of an Asynchronous Clock Switching System consistent with the principles of the present invention.

In FIG. 1, an exemplary block diagram of the Asynchronous Clock Switching System 100 is illustrated. The Asynchronous Clock Switching System 100 may comprise Selection Signals 110, a Detector 115, a Requester 130, Signal Output 120, Asynchronous Clock Signals 105, control signals 135 and a selected-clock 125 signal. The Requestor 130 is coupled to the Selection Signals 110 and the Signal Output 120. The Detector 115 is coupled to the Selection Signals 110 and the Signal Output 120. The Signal Output 120 is coupled to the Detector 115 and Requestor 130. The selected-clock 125 signal is released form the Signal Output 120. The Requestor 130 receives data from the control signals 135, which indicate the requested Asynchronous Clock Signal 105. The Requestor 130 then informs the Selection Signals 110 of the requested Asynchronous Clock Signal 105. The Selection Signals 110 receives the request and determines which Asynchronous Clock Signal 105 was selected. The Detector 115 detects the selected Asynchronous Clock Signal 105 and directs it to the Signal Output 120. The Signal Output 120 releases the selected_clock 125 signal.

Figure 2:
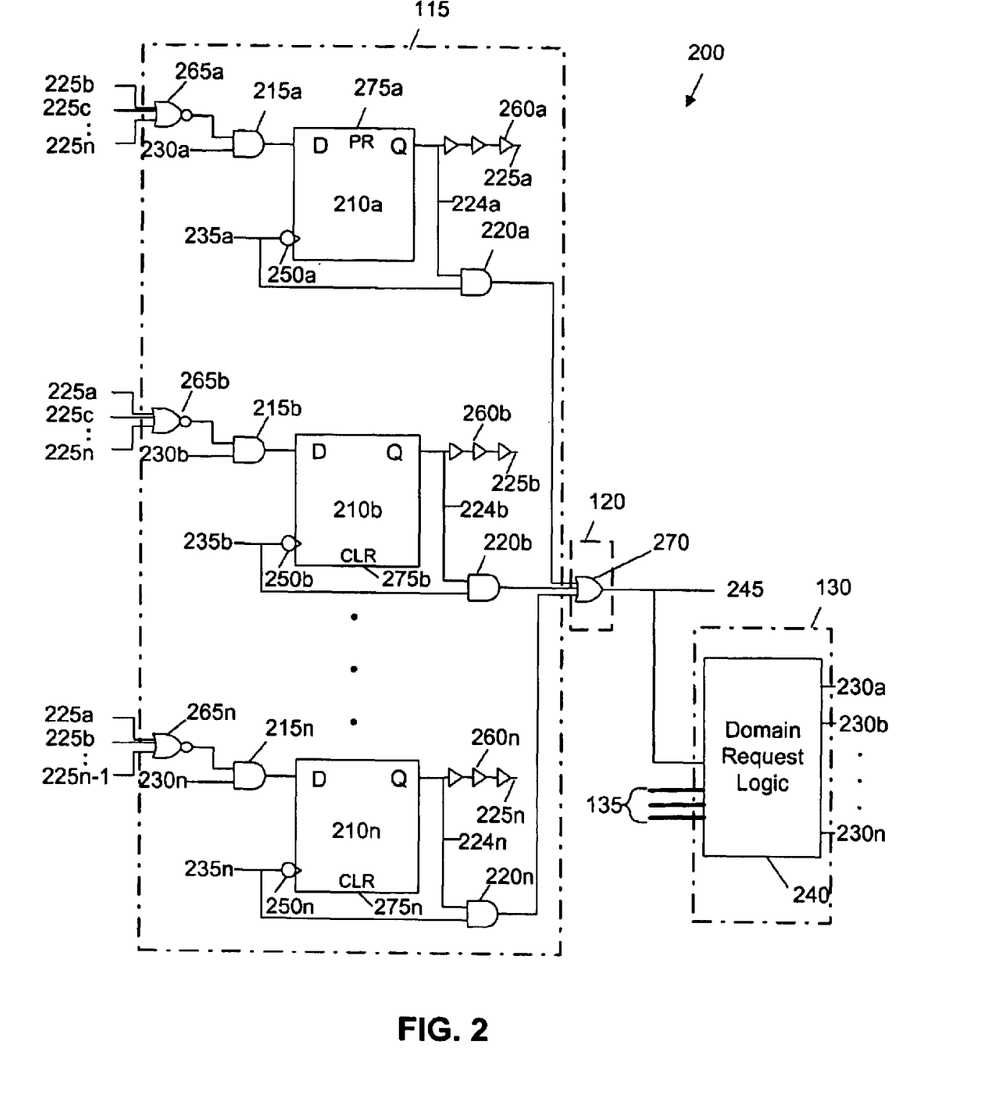
FIG. 2 is an embodiment of a circuit consistent with the principles of the present invention for implementing the Asynchronous Clock Switching System of FIG. 1 for two or more asynchronous clock signals.

FIG. 2 is an embodiment of a circuit consistent with the principles of the present invention for implementing the Asynchronous Clock Switching System 100 of FIG. 1 for two or more asynchronous clock signals. The portion of the Detector 115 that receives the asynchronous clock signal 235a as an input will be discussed. The remaining portions of the Detector 115 function in the same manner as the portion of the Detector 115 that receives asynchronous clock signal 235a as an input.

The Requestor 130, which may comprise the Domain Request Logic 240, requests an asynchronous clock signal 235a–235n and sends this request to the request_domain signals 230a–n in the Asynchronous Clock Switching System 200. Based on the request_domain signal 230a–n chosen, a select_domain signal 224a–n, which is used to select an asynchronous clock signal 235a–n, is selected. The selected_clock signal 245 is produced through this system.

As illustrated in FIG. 2, the asynchronous clock signal 235a connects to inverter 250a and then to the state machine, D flip-flop 210a. The Q output of the D flip-flop 210a is the select_domain signal 224a, which then results in the generation of the delayed_select_domain signal 225a via the buffer 260a. The D input or data input of the D flip-flop 210a receives a signal based on various inputs. The connection to the D input of the D flip-flop 210a begins with a signal from a second detector logic gate, AND gate 215a. The AND gate 215a receives two inputs from a first detector logic gate, NOR gate 265a and a request_domain signal 230a. The NOR gate 265a receives signals from delayed_select_domain signals 225b–n. The NOR gate 265a will not receive a select_domain signal that is the produced by the Decoder 115 on which it is located. Therefore, the NOR gate 265a for the portion of the Decoder 115 that receives asynchronous clock signal 235a, will not receive delayed_select_domain signal 225a as an input.

The NOR gate 265a ensures that not more than one of the delayed_select_domain signals 225b–n is selected at the same time. If delayed_select_domain 225b is high, the NOR gate 265a will prevent the remaining delayed_select_domain signals 225c–n from passing through.

The select_domain signals 224a–n are fed through buffers 260a–n to generate the delayed_select_domain signals 225a–n, in order to ensure that the request_domain signals 230a–n travel faster than the select_domain signals.

The select_domain signal 224a and the asynchronous clock signal 235a is fed into the third detector logic gate, AND gate 220a as inputs. If asynchronous clock signal 235a is the requested signal, it will result in a high signal on select_domain signal 224a. If asynchronous clock signal 235a is not the requested signal it will result in a low signal on select_domain signal 224a. A low signal into an AND gate will result in a low output. Therefore, if select_domain signal 224a is low, the output of AND gate 220a will be low.

The output from the AND gate 220a is fed into Signal Output 120, which may comprise an OR gate 270, along with the output from the other AND gates 220b–n. The output of the OR gate 270 is the selected_clock signal 245. The selected_clock signal 245 is also fed to the Domain Request Logic 240.

Figure 3:
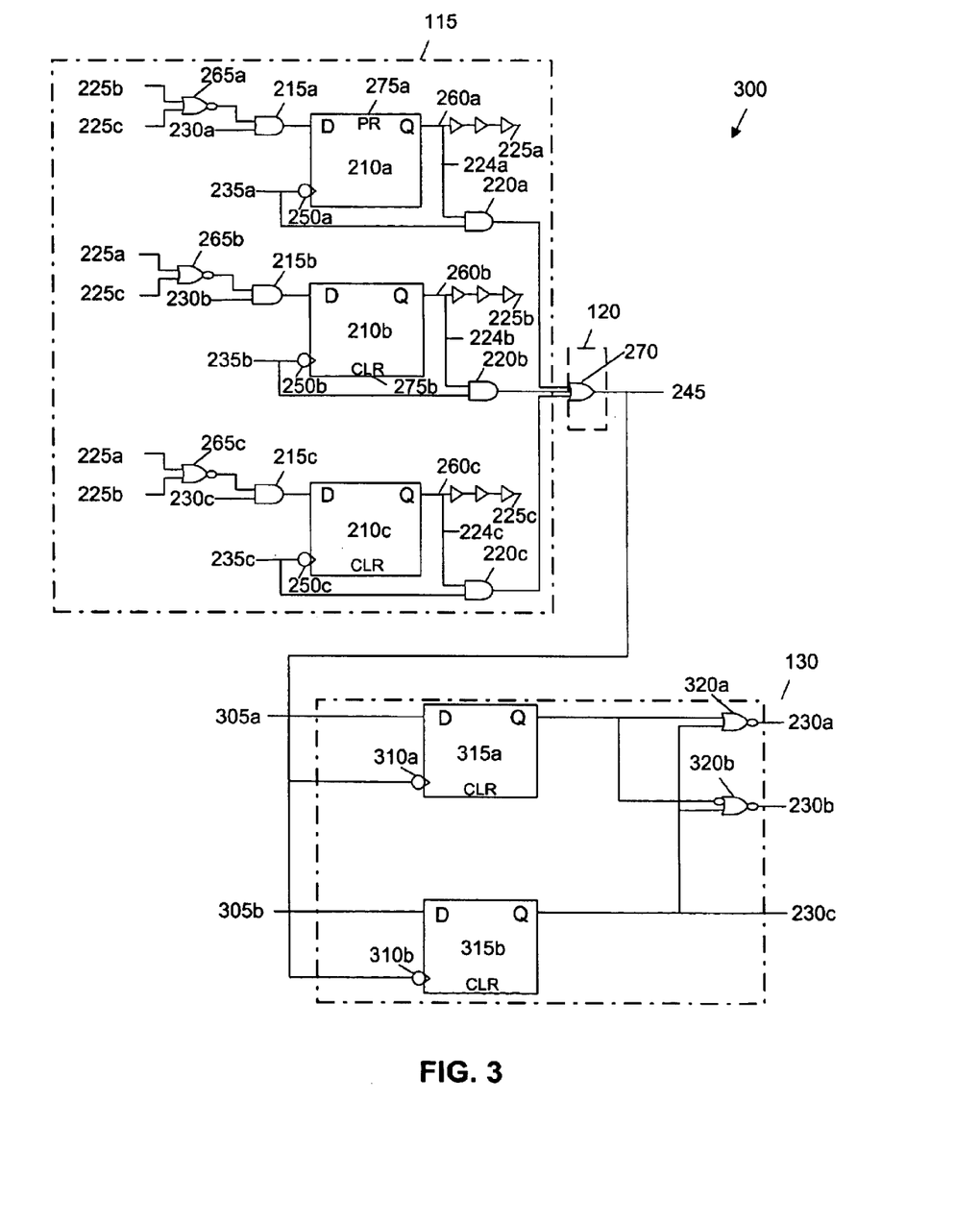
FIG. 3 is an embodiment of a circuit consistent with the principles of the present invention capable of implementing the Asynchronous Clock Switching System of FIG. 1 with three asynchronous clock signals.

FIG. 3 is an embodiment of a circuit consistent with the principles of the present invention capable of implementing the Asynchronous Clock Switching System 100 of FIG. 1 with three asynchronous clock signals. The system in FIG. 3 is a three clock embodiment of the n clock embodiment presented in FIG. 2.

In FIG. 3, the components that make up the Domain Request Logic 240 for a three clock system are displayed along with the components of a three clock system. The Detector 115 encloses the components that are used in detecting a clock signal. The Signal Output 120 encloses the component used in producing an output. The Requestor 130 encloses the components used in making a request.

A request is made for a particular asynchronous clock signal 235a–c based on the encoded_request_domain signals 305a–b selected. If neither encoded_request_domain signals 305a–b are selected, two low signals are sent through the encoded_request_domain signals 305a–b. Encoded_request_domain signals 305a–b are input to the state machine, D flip-flops 315a–b, respectively. The two low signals generate a high signal on request_domain signal 230a and two low signals on request_domain signal 230b and request_domain signal 230c. Therefore, asynchronous clock signal 235a has been selected.

Delayed_select_domain signal 225b and delayed_select_domain signal 225c are low, since neither of their request_domains 230b–230c were selected. This results in a high signal for the output of a first detector logic gate, NOR gate 265a. The high signal output of the NOR gate 265a and the high signal of the request_domain signal 230a are inputs in the second detector logic gate, AND gate 215a and result in a high signal output from output Q of D flip-flop 210a. Asynchronous clock signal 235a, along with select_domain signal 224a, is input into a third detector logic gate, AND gate 220a. The result of the AND is the asynchronous clock signal 235a.

The remaining AND gates 220b–220c will produce low signal outputs, since NOR gate 265b and NOR gate 265c will produce low signals. Any low signal input into an AND gate will result in a low output. Therefore, asynchronous clock signal 235a is the only selected_clock signal 245 present at the output of the OR gate 270.

Through this system, a request for a certain clock signal will result in an output of the clock signal.

Figure 4:
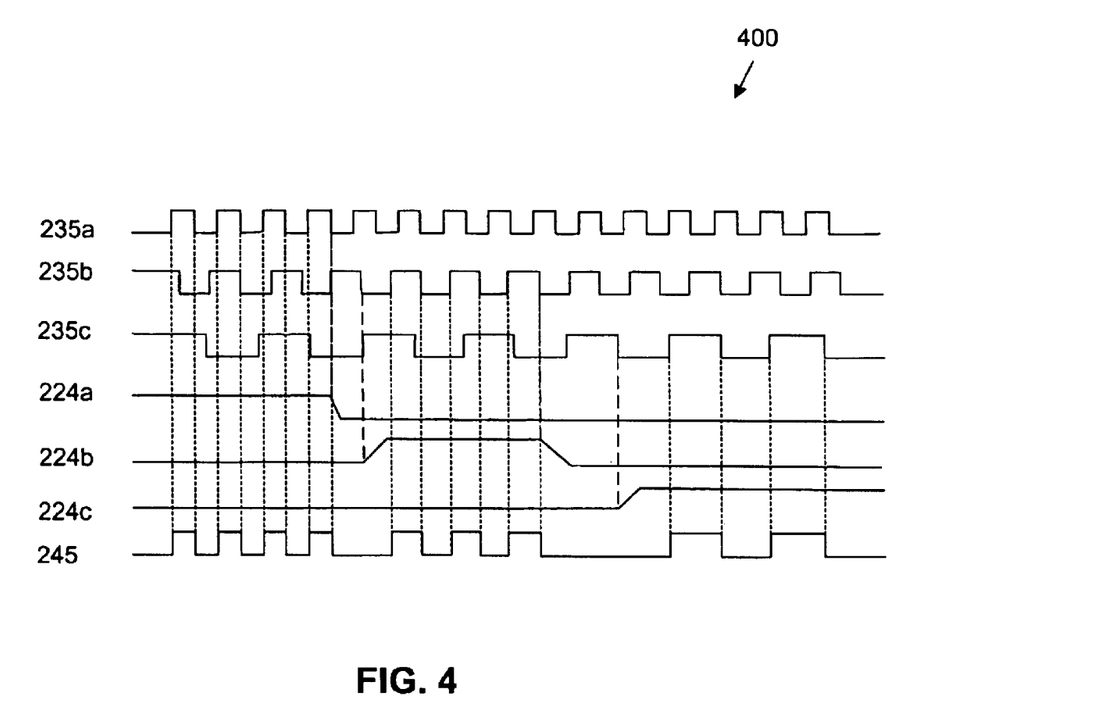
FIG. 4 is a timing diagram illustrating switching between the asynchronous clock signals.

FIG. 4 is a timing diagram illustrating switching between the asynchronous clock signals. The default selected_clock signal 245 is asynchronous clock signal 235a. As can be seen in FIG. 3, the initial reset state of the D flip-flops 210a–210c, will result in the select_domain signal 224a being a one, while the select_domain signals 224b–224c will both be zeros. Therefore, asynchronous clock signal 235a is the first signal displayed in the selected_clock 245 region. While the select_domain signal 224a is high, the selected_clock 245 is asynchronous clock signal 235a. When the select_domain signal 224a becomes low, there is a brief period where a clock signal has not been selected.

After this brief period, select_domain signal 224b goes high and the signal from asynchronous clock signal 235b is selected. Asynchronous clock signal 235b continues until select_domain signal 224b goes low. Once again, there is a brief period where a clock signal has not been selected.

Finally, select_domain signal 224c has a high signal and asynchronous clock signal 235c is selected.

In all of the above examples, the clock signal was latched on or selected on the falling edge of the clock.

Figure 5:
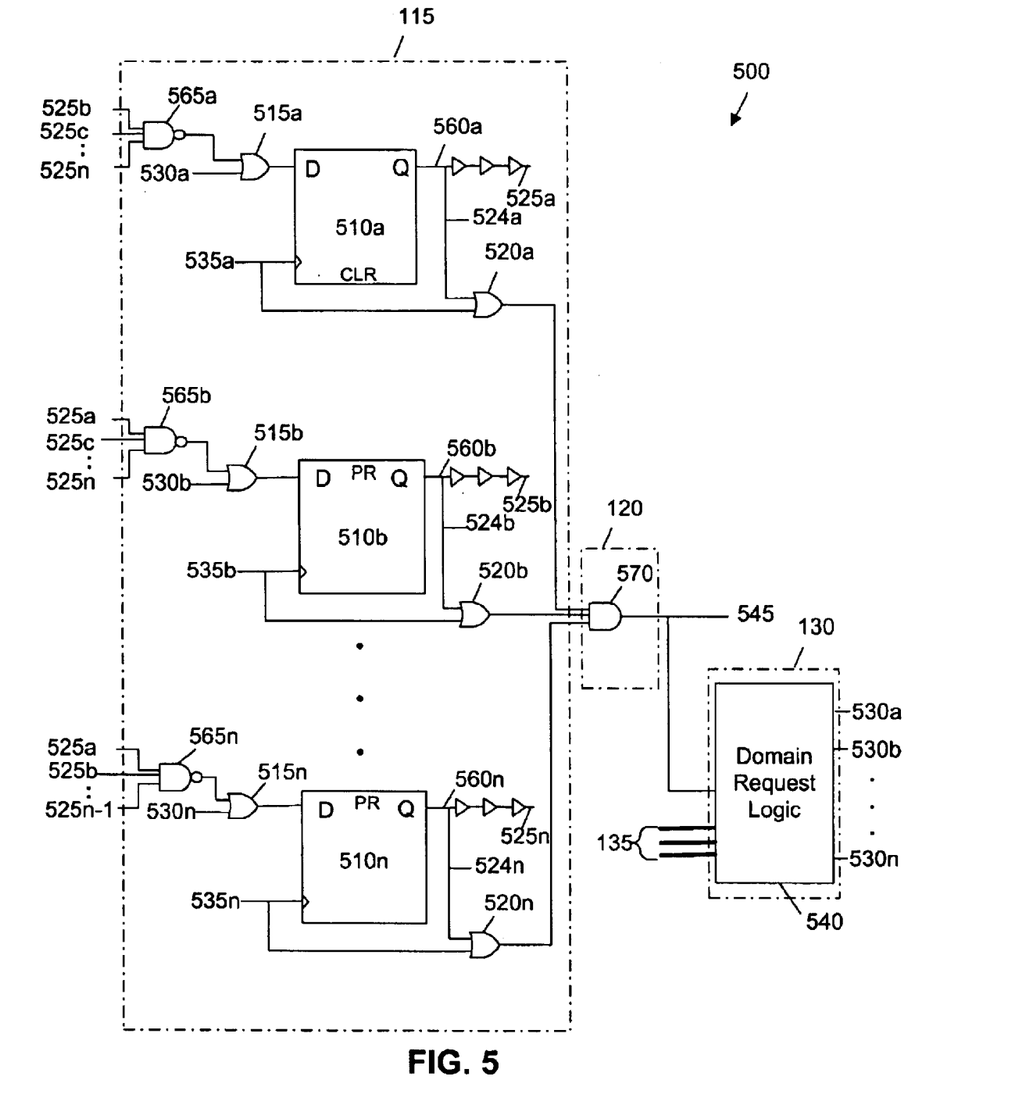
FIG. 5 is an embodiment of a circuit capable of implementing the Asynchronous Clock Switching System of FIG. 1 that switches on the rising edge of the clock signal.

FIG. 5 is an embodiment of a circuit capable of implementing the Asynchronous Clock Switching System 100 of FIG. 1 that switches on the rising edge of the clock signal. This means that a signal is active when low and inactive when high. The system's response to signals has, therefore, been inverted.

The D input of the state machine, D flip-flop 510a receives the output of the second detector logic gates, OR gates 515a. The OR gate 515a receives the output of the NAND gate 565 and the request_domain_bar signal 530a as its input. The first detector logic gate, NAND gate 565 receives delayed_select_domain_bar signals 525b–525n as its input. The Q output of the D flip-flop 510 feeds into the third detector logic gate, OR gate 520a. The Q output of D flip-flop 510a is also the select_domain bar signal 524a. Asynchronous clock signal 535 is also connected to the OR gate 520a as an input.

The output of OR gate 520a is fed to the AND gate 570. The AND gate 570 receives the output of all the OR gates 520a–n. The output of the AND gate 570 is the selected_clock 545, a branch of the selected_clock 545 output is fed to the Domain Request Logic 540.

Figure 6:
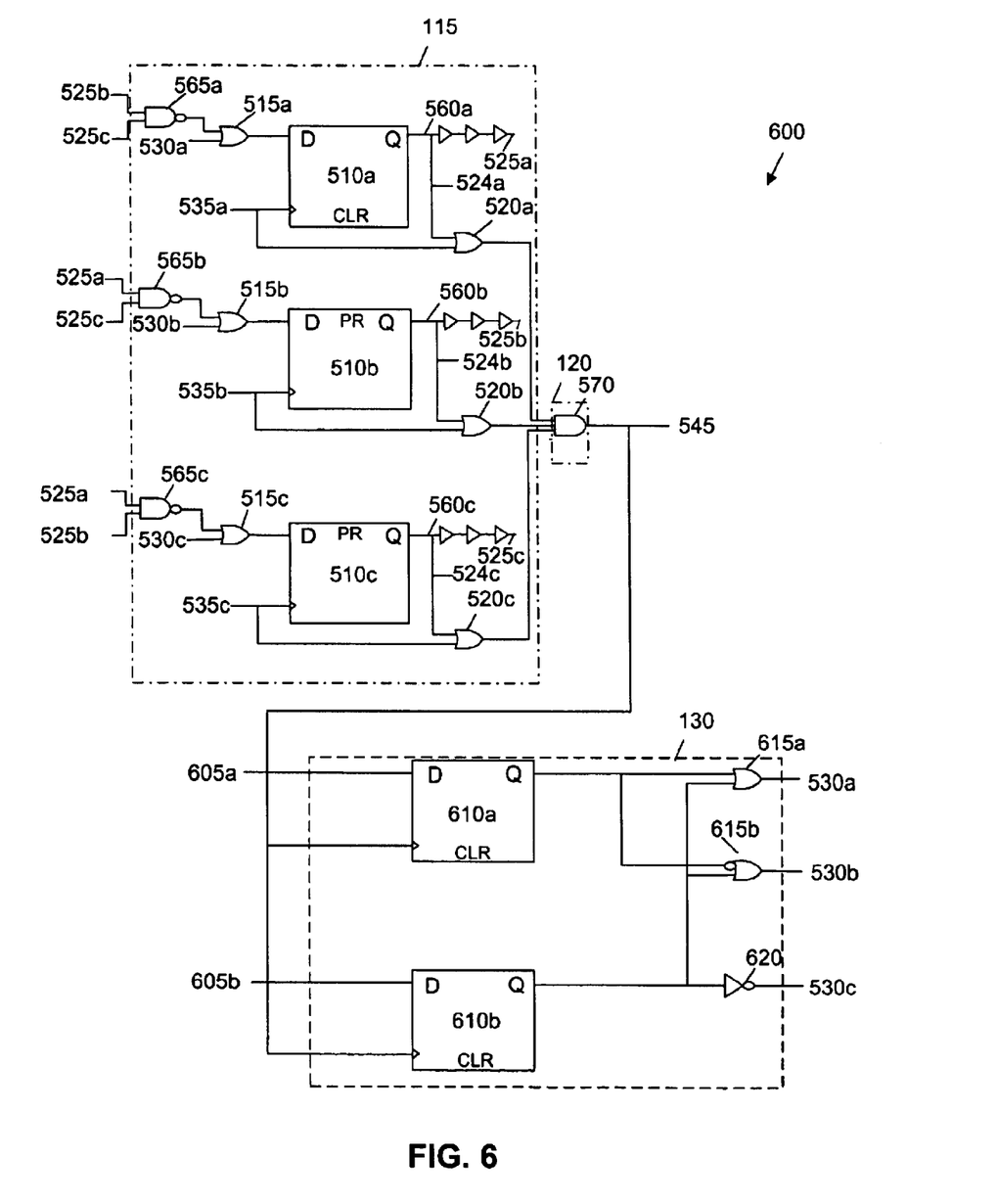
FIG. 6 illustrates a detailed view of the Domain Request Logic of FIG. 5 along with the system in FIG. 5.

FIG. 6 illustrates a detailed view of the Domain Request Logic 540 of FIG. 5 along with the system in FIG. 5. The signals received on encoded_request_domain signal 605a and encoded_request_domain signal 605b determine which clock will be selected. For example, if encoded_request_domain signal 605a and encoded_request_domain signal 605b both have low signals, then request_domain_bar signal 530a will have a low signal and asynchronous clock signal 535a will be selected.

Request_Domain_bar signal 530b will have a high signal since a high signal ORed with a low signal results in a high signal. Request_Domain_bar signal 530c will also have a high signal since the inverter 620 receives a low signal and outputs a high signal. Since the present system is active low, the low signal selects the clock.

Figure 7:
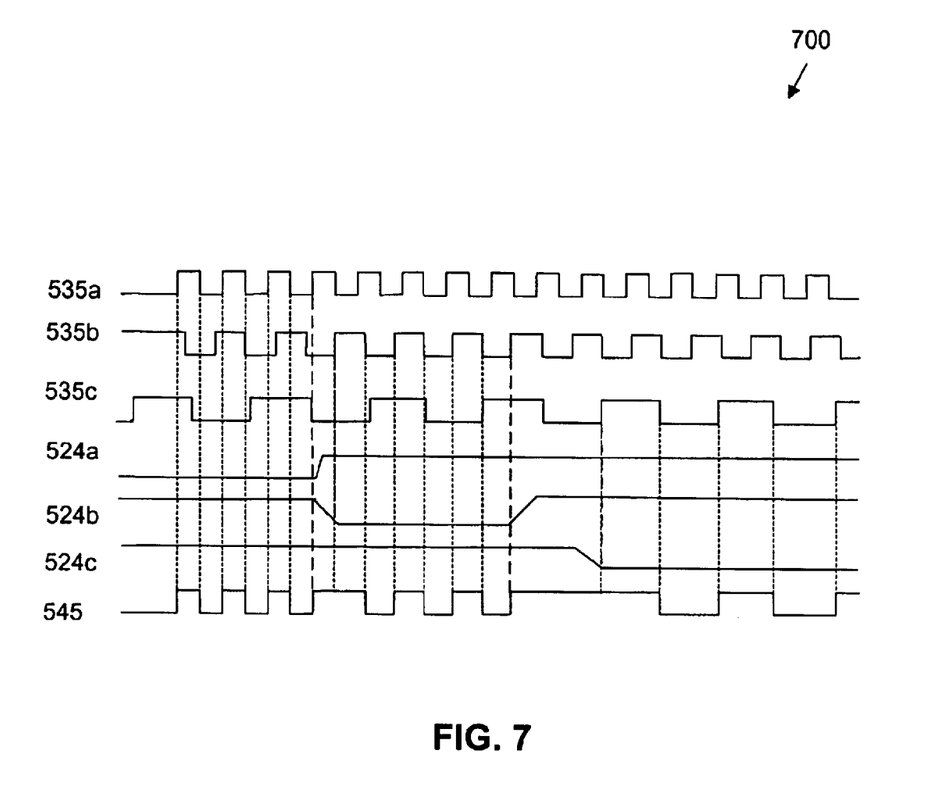
FIG. 7 is a timing diagram illustrating switching between the asynchronous clock signals in FIG. 6.

FIG. 7 is a timing diagram illustrating switching between the asynchronous clock signals in FIG. 6. Select_domain_bar signal 524a has a low signal and therefore clock signal 530a is the selected_clock 545. At a later point, select_domain_bar signal 524a goes high and select_domain_bar signal 524b goes low. At this point, select_domain_bar signal 524c goes low after select_domain_bar signal 524b goes high. At this point, asynchronous clock signal 535c becomes the selected_clock 545. It is also important to note that the clock is selected or latched at the rising edge of the clock signal.

Figure 8:
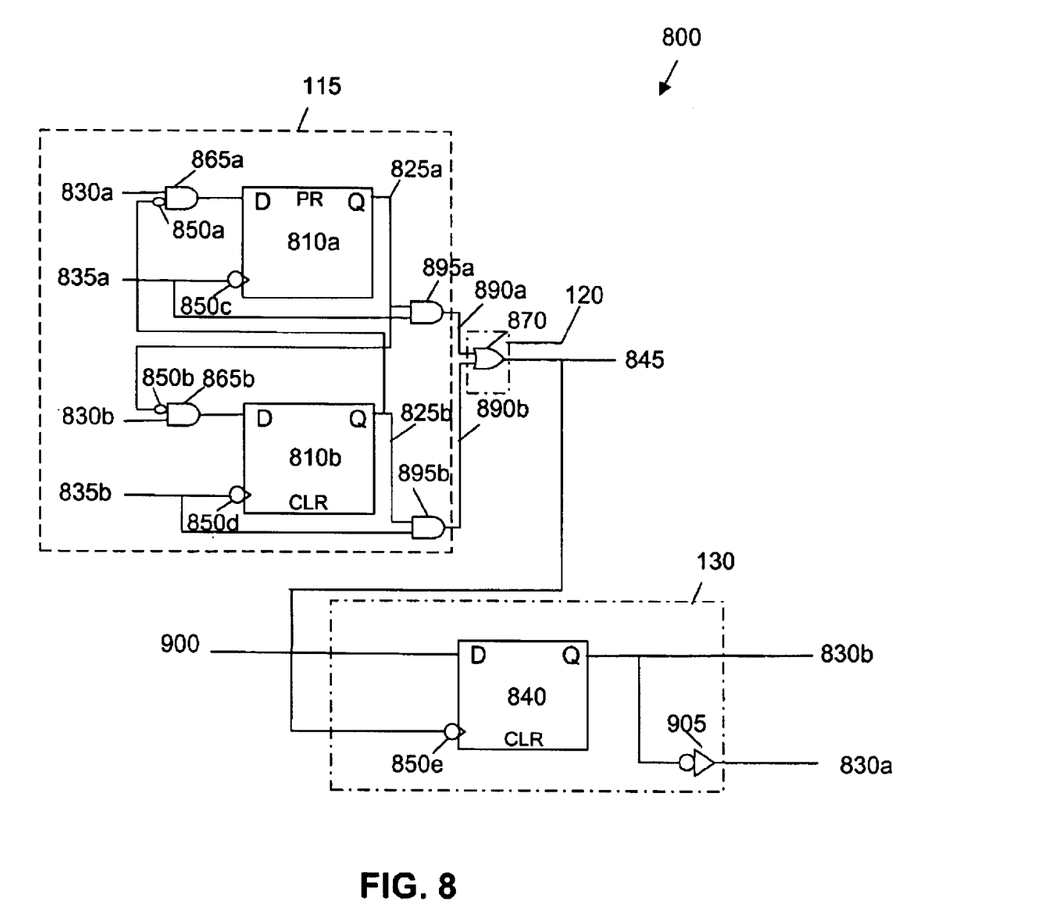
FIG. 8 illustrates an embodiment of a circuit capable of implementing the two clock Asynchronous Clock Switching System.

FIG. 8 illustrates an embodiment of a circuit capable of implementing the two clock Asynchronous Clock Switching System 800.

The state machine, D flip-flop 840 receives control 900 at its D input and selected_clock 845 as an input. D flip-flop 840 outputs at its Q output to request_domain signal 830b. The output of Q is also fed to inverter 905, which outputs to request_domain signal 830a.

The control 900 serves to select the clock signal that will be requested. If the control 900 is a low signal, then request_domain signal 830a will be selected. A low signal input into D flip-flop 840 results in a low signal from the Q output of D flip-flop 840. The low signal output is converted into a high signal for request domain signal 830a due to inverter 905.

Request_domain signal 830a is fed into the first detector logic gate, AND gate 865a and request_domain signal 830b is fed into AND gate 865b. The Q output of D flip-flop 810a, which is also select_domain signal 825a, is fed into inverter 850b and into AND gate 865b. The Q output of D flip-flop 810b, which is also select_domain signal 825b, is fed into inverter 850a and into AND gate 865a. The output of AND gate 865a is fed into the D input of D flip-flop 810a. The output of AND gate 865b is fed into the D input of D flip-flop 810b. Asynchronous clock signal 835a is fed into inverter 850c and then into D flip-flop 810a. Asynchronous clock signal 835b is fed into inverter 850d and then into D flip-flop 810b. Select_domain signal 825a and asynchronous clock signal 835a are fed into the second detector logic gate, AND gate 895a. Select_domain signal 825b and asynchronous clock signal 835b are fed into AND gate 895b. The output of AND gate 895a, which is AND_clock signal 890a, and the output of AND gate 895b, which is AND_clock signal 890b, is fed into OR gate 870. The output of OR gate 870 is the selected_clock 845.

As discussed earlier, a low signal from control 900 results in a high request_domain signal 830*a* signal. A high signal on request_domain signal 830*a* and a low signal from select_domain signal 825*b* results in a high signal on select_domain signal 825*a*. The low signal from select_domain signal 825*b* results in a low signal from AND gate 895*b*. The AND gate 895*a* receives asynchronous clock signal 835*a* and a high signal from select_domain signal 825*a*. This results in asynchronous clock signal 835*a* on AND_clock signal 890*a*. The signal on AND_clock signal 890*a* and the low signal at AND_clock signal 890*b* result in asynchronous clock signal 835*a* as the output of the OR gate 890. Therefore, asynchronous clock signal 835*a* is the selected_clock 845. This selected_clock 845 is fed into D flip-flop 840.

Figure 9:
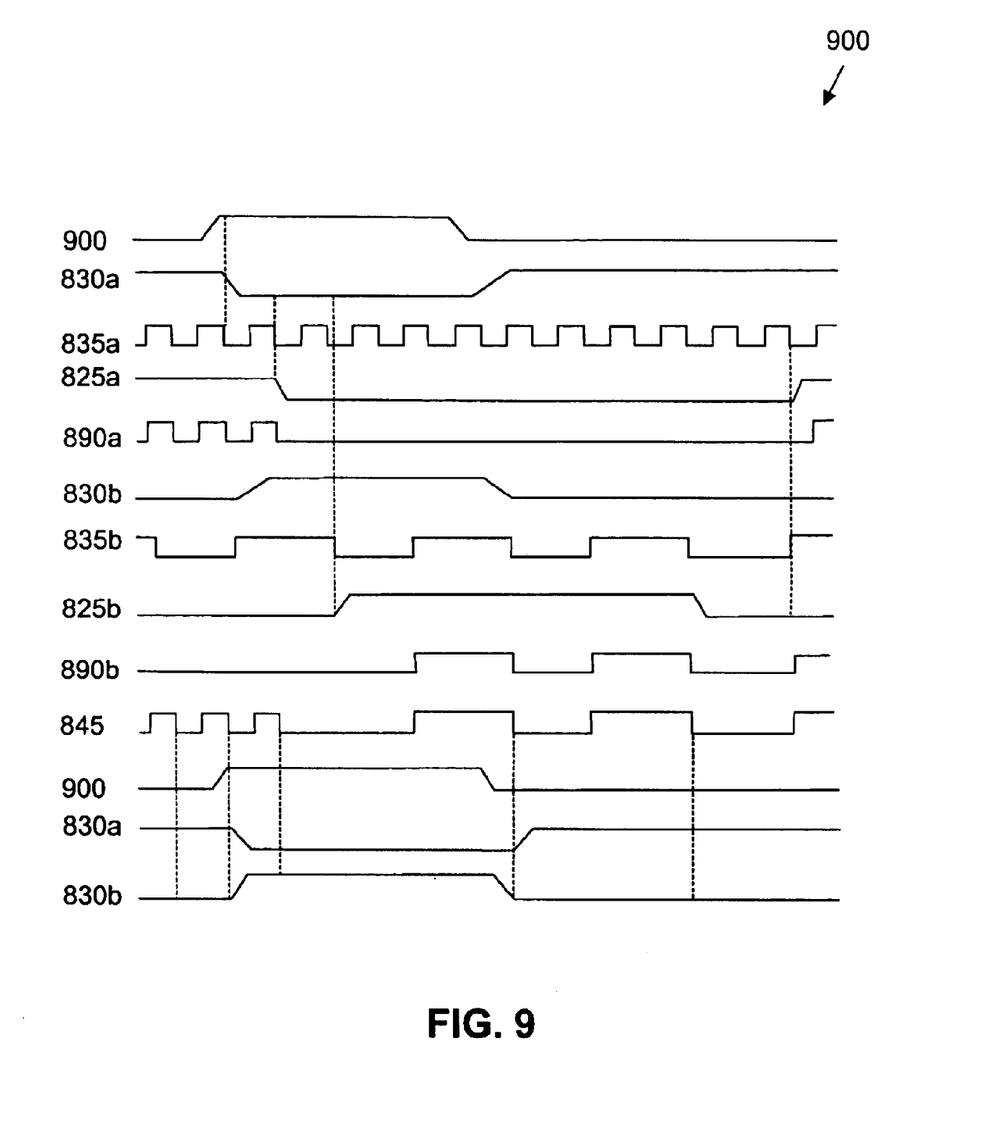
FIG. 9 is a timing diagram illustrating switching between two asynchronous clocks

FIG. 9 is a timing diagram illustrating switching between two asynchronous clocks. As illustrated by the timing diagram, when control 900 is low, selected_clock 845 is the asynchronous clock signal 835*a*. When control 900 is high, selected_clock 845 is the clock signal 835*b*.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An asynchronous clock switching system comprising:
   two or-more asynchronous clock-signals;
   a detector for detecting a selected one of the two or more asynchronous clock signals, the detector including a detector first input, a detector second input, a detector third input, a detector first output, and a detector second output;
   the detector first input coupled to the two or more asynchronous clock signals;
   the detector second input coupled to the detector first output;
   a requestor, for sending request signals that request the selected one of the two or more asynchronous clock signals, the requestor including a requestor first input, a requestor second input, and requestor first output;
   the requestor first output, for sending selection signals, including a delay, coupled to the detector third input;
   control signals, coupled to the requestor second input, for indicating a requested asynchronous clock signal;
   a signal output, for outputting the selected asynchronous clock signal, the signal output including a signal output first input, and a signal output first output;
   the signal output first input coupled to the detector second output; and
   the signal output first output coupled to the requestor first input.

2. The asynchronous clock switching system of claim 1, wherein the delay in the selection signals allows the request signals to travel through the asynchronous dock switching system faster than the selection signals.

3. An asynchronous clock switching system comprising:
   two or more asynchronous clock signals;
   a requestor including a requestor first input, a requestor second input, and a requestor first output;
   one or more control signals input into the requestor second input;
   one or more request signals output from the requestor first output;
   a plurality of second detector logic gates, each including a second detector logic gate first input, a second detector logic gate second input, and a second detector logic gate first output
   each second detector logic gate second input receiving a respective one of the one or more request signals;
   a plurality of state machines, each including a state machine first input, a state machine second input, and a state machine first output;
   each state machine first input receiving the corresponding second detector logic gate first output;
   each asynchronous clock signal coupled to an inverter coupled to each state machine second input;
   a plurality of first detector logic gates each including a plurality of first detector logic gate first input and a first detector logic gate first output;
   selection signals output from each state machine first output and coupled to buffers and to each first detector logic gate first input not associated with the respective state machines;
   each first detector logic gate output coupled to the second detector logic gate first input;
   a plurality of third detector logic gates, including a third detector logic gate first input, a third detector logic gate second input, and a third detector logic gate first output;
   each third detector logic gate second input coupled to one of the two or more asynchronous clock signals;
   each third detector logic gate first input coupled to the state machine first output;
   a signal output, including a signal output first input, and a signal output first output;
   each third detector logic first output is coupled to the signal output first input; and the signal output first output is coupled to the requestor first input.

4. The asynchronous clock switching system as described in claim 3, wherein the first detector logic gates comprise NOR gates.

5. The asynchronous clock switching system as described in claim 3, wherein the second detector logic gates comprise AND gates.

6. The asynchronous clock switching systems described in claim 3, wherein the third detector logic gates comprise AND gates.

7. The asynchronous clock switching system as described in claim 3, wherein the signal output is an OR gate.

8. The asynchronous clock switching system as described in claim 3, wherein the state machines comprise D flip-flops.

9. The asynchronous dock switching system of claim 3, wherein the buffers allow the request signals to travel through the asynchronous clock switching system faster than the one or more selection signals.

10. An asynchronous clock switching system comprising:
    two or more asynchronous clock signals;
    a requestor including a requestor first input, a requestor second input, and a requestor first output;
    one or more control signals input into the requestor second input;
    one or more request signals output from the requester first output;
    a plurality of second detector logic gates, each including a second detector logic gate first input, a second detector logic gate second input, and a second detector logic gate first output;
    each second detector logic gate second input receiving a respective of the one or more request signals;

a plurality of state machines, each including a state machine first input, state machine second input, and a state machine first output;

each state machine first input receiving the corresponding second detector logic gate first output;

a plurality of first detector logic gates, each including a plurality of first detector logic gate first inputs and a first detector logic gate first output;

selection signals output from each state machine first output and coupled to buffers and to each first detector logic gates first input not associated with the respective state machines;

each first detector logic gate output coupled to the second detector logic gate first input;

a plurality of third detector logic gates, including a third detector logic gate first input, a third detector logic gate second input, and a third detector logic gate first output;

each third detector logic gate second input coupled to one of the two or more asynchronous clock signals;

each third detector logic gate first input coupled to the state machine first output;

a signal output, including a signal output first input, and a signal output first output;

each third detector logic first output is coupled to the signal output first input; and the signal output first output is coupled to the requestor first input.

11. The asynchronous clock switching system as described in claim 10, wherein the first detector logic gates comprise NAND gates.

12. The asynchronous clock switching system as described in claim 10, wherein the second detector logic gates comprise OR gates.

13. The asynchronous clock switching system as described in claim 10, wherein the third detector logic gates comprise OR gates.

14. The asynchronous clock switching system as described in claim 10, wherein the signal output is an AND gate.

15. The asynchronous clock switching system as described in claim 10, wherein the state machines comprise D flip-flops.

16. The asynchronous crock switching system of claim 10, wherein the buffers allow the request signals to travel through the asynchronous clock switching system faster than the one or more selection signals.

17. An asynchronous clock switching system comprising:

two asynchronous clock signals;

a requestor including a requestor first input, a requestor second input, and a requestor first output;

one control signal input into the requester first input; two;

request signals output from the requestor first output, wherein one of the request signals is inverted;

two first detector logic gates each including a first detector logic gate first input, a first detector logic gate second input, and a first detector logic gate first output;

each first detector logic gate receives a respective one of the two request signals;

two state machines, each including a state machine first input, a state machine second input, and a state machine first output;

each state machine first input receiving the first detector logic gate first output;

two second detector logic gates, each including a second detector logic gate first input, a second detector logic gate second input, and a second detector logic gate first output;

selection signals coupled to each first detector logic first input not associated with the respective state machine;

each asynchronous clock signal coupled to an inverter coupled to each state machine second input;

each second detector logic state second input coupled to one of the two asynchronous clock signals;

a signal output, including a signal output first input and a signal output first output;

each second detector logic first output coupled to the signal output first input; and the signal output first output coupled to an inverter coupled to the requestor second input.

18. The asynchronous clock switching system of claim 17, wherein the first two detector logic gates are AND gates.

19. The asynchronous clock switching system of claim 17, wherein the second detector logic gates are AND gates.

20. The asynchronous clock switching system of claim 17, wherein the signal output is an OR gate.

21. The asynchronous clock switching system as described in claim 17, wherein the two state machines comprise D flip-flops.

\* \* \* \* \*

UNITED STATES PATENT AND TRADEMARK OFFICE
CERTIFICATE OF CORRECTION

PATENT NO.    : 6,842,052 B2
DATED         : January 11, 2005
INVENTOR(S)   : William V. Miller It is certified that error appears in the above-identified patent and that said Letters Patent is hereby corrected as shown below:

Column 7,
Line 29, "or-more asynchronous clock-signals;" should read -- or more asynchronous clock signals; --.
Line 43, "and requestor" should read -- and a requestor --.
Line 58, "dock" should read -- clock --.

Column 8,
Line 4, "output" should read -- output; --.
Line 15, "gates each" should read -- gates, each --.
Line 21, "machines;" should read -- machine; --
Line 42, "systems" should read -- system as --.
Line 49, "dock" should read -- clock --.
Line 60, "requester" should read -- requestor --.
Line 67, "respective of" should read -- respective one of --.

Column 9,
Line 11, "gates" should read -- gate --.
Line 12, "machines;" should read -- machine; --.
Line 44, "crock" should read -- clock --.

Column 10,
Line 5, "requester" should read -- requestor --.
Lines 5-6, "two; request" should read -- two request --.
Line 9, "gates each" should read -- gates, each --.
Line 24, "logic first" should read -- logic gate first --.
Line 28, "logic state" should read -- logic gate --.
Line 38, "first two detector" should read -- first detector --.

UNITED STATES PATENT AND TRADEMARK OFFICE
CERTIFICATE OF CORRECTION

PATENT NO. : 6,842,052 B2
DATED : January 11, 2005
INVENTOR(S) : William V. Miller It is certified that error appears in the above-identified patent and that said Letters Patent is hereby corrected as shown below:

Column 10 (cont'd),
Line 44, "the two state" should read -- the state --.

Signed and Sealed this

Twenty-fourth Day of May, 2005

JON W. DUDAS
*Director of the United States Patent and Trademark Office*